(12) United States Patent
Ting et al.

(10) Patent No.: US 7,453,120 B2
(45) Date of Patent: Nov. 18, 2008

(54) SEMICONDUCTOR STRUCTURE

(75) Inventors: Shyh-Fann Ting, Gangshan Township, Kaohsiung County (TW); Cheng-Tung Huang, Kaohsiung (TW); Wen-Han Hung, Kaohsiung (TW); Li-Shian Jeng, Taitung (TW); Tzyy-Ming Cheng, Hsinchu (TW)

(73) Assignee: Unitd Microelectronics Corp., Hsinchu (TW)

( * ) Notice: Subject to any disclaimer, the term of this patent is extended or adjusted under 35 U.S.C. 154(b) by 0 days.

(21) Appl. No.: 11/777,973

(22) Filed: Jul. 13, 2007

(65) Prior Publication Data

US 2007/0257321 A1 Nov. 8, 2007

Related U.S. Application Data

(62) Division of application No. 11/400,077, filed on Apr. 6, 2006.

(51) Int. Cl.
*H01L 27/092* (2006.01)
*H01L 29/78* (2006.01)

(52) U.S. Cl. ............... 257/338; 257/336; 257/344; 257/369; 257/382; 257/384; 257/E21.634; 257/E27.064

(58) Field of Classification Search ............ 438/300, 438/230; 257/E21.634, E27.062, E27.064, 257/E27.067, 338, 351, 369, 371, 382, 384, 257/408, 336, 344

See application file for complete search history.

(56) References Cited

U.S. PATENT DOCUMENTS

| | | | | |
|---|---|---|---|---|
| 5,710,450 A * | 1/1998 | Chau et al. | ............... | 257/344 |
| 5,908,313 A * | 6/1999 | Chau et al. | ............... | 438/299 |
| 6,465,311 B2 * | 10/2002 | Shenoy | ............... | 438/300 |
| 6,812,086 B2 * | 11/2004 | Murthy et al. | ............... | 438/231 |
| 7,041,543 B1 * | 5/2006 | Varadarajan et al. | ........ | 438/197 |
| 7,052,946 B2 * | 5/2006 | Chen et al. | ............... | 438/199 |
| 7,078,285 B1 * | 7/2006 | Suenaga | ............... | 438/199 |
| 7,118,977 B2 * | 10/2006 | Chidambaram et al. | ..... | 438/300 |
| 7,118,999 B2 * | 10/2006 | Yang et al. | ............... | 438/586 |
| 7,132,338 B2 * | 11/2006 | Samoilov et al. | ........... | 438/300 |
| 7,148,143 B2 * | 12/2006 | Bu et al. | ............... | 438/682 |
| 7,151,034 B2 * | 12/2006 | Lee et al. | ............... | 438/300 |
| 7,166,528 B2 * | 1/2007 | Kim et al. | ............... | 438/607 |
| 7,172,933 B2 * | 2/2007 | Huang et al. | ............... | 438/197 |
| 7,193,254 B2 * | 3/2007 | Chan et al. | ............... | 257/274 |
| 7,195,985 B2 * | 3/2007 | Murthy et al. | ............... | 438/341 |
| 7,202,120 B2 * | 4/2007 | Shima et al. | ............... | 438/153 |
| 7,220,630 B2 * | 5/2007 | Cheng et al. | ............... | 438/199 |
| 2004/0262694 A1 * | 12/2004 | Chidambaram | ............ | 257/369 |
| 2005/0095795 A1 * | 5/2005 | Son et al. | ............... | 438/300 |
| 2006/0057810 A1 * | 3/2006 | Smith et al. | ............... | 438/300 |
| 2006/0115949 A1 * | 6/2006 | Zhang et al. | ............... | 438/300 |
| 2006/0199285 A1 * | 9/2006 | Chidambaram et al. | ....... | 438/14 |
| 2006/0216876 A1 * | 9/2006 | Kim et al. | ............... | 438/149 |

(Continued)

*Primary Examiner*—M. Wilczewski
(74) *Attorney, Agent, or Firm*—J.C. Patents (57) ABSTRACT

A method for fabricating a semiconductor structure is described. A substrate is provided, having thereon a gate structure and a spacer on the sidewall of the gate structure and having therein an S/D extension region beside the gate structure. An opening is formed in the substrate beside the spacer, and then an S/D region is formed in or on the substrate at the bottom of the opening. A metal silicide layer is formed on the S/D region and the gate structure, and then a stress layer is formed over the substrate.

13 Claims, 6 Drawing Sheets

U.S. PATENT DOCUMENTS

2006/0226453 A1* 10/2006 Wang et al. .................. 257/288
2007/0099388 A1* 5/2007 Jain ........................... 438/301
2007/0128786 A1* 6/2007 Cheng et al. ................. 438/199
2007/0148835 A1* 6/2007 Shima et al. ................. 438/153

* cited by examiner

SEMICONDUCTOR STRUCTURE

This application is a divisional application of, and claims the priority benefit of, U.S. application Ser. No. 11/400,077 filed on Apr. 6, 2006.

BACKGROUND OF THE INVENTION

1. Field of the Invention

The present invention relates to a semiconductor structure. More particularly, the present invention relates to a semiconductor structure that causes higher stress in the channel direction of a MOS transistor, and to a method for fabricating the same.

2. Description of the Related Art

In advanced metal-oxide-semiconductor (MOS) process, a stress layer is usually formed over a MOS transistor to improve the electron or hole mobility in the channel. In a MOS process of 65 nm or below, a compressive stress layer is formed over a PMOS transistor to cause compressive stress in its channel direction and improve hole mobility, while a tensile stress layer is formed over an NMOS transistor to cause tensile stress in its channel direction and improve electron mobility. Thereby, the driving currents are increased improving the performance of the product.

Figure 1:
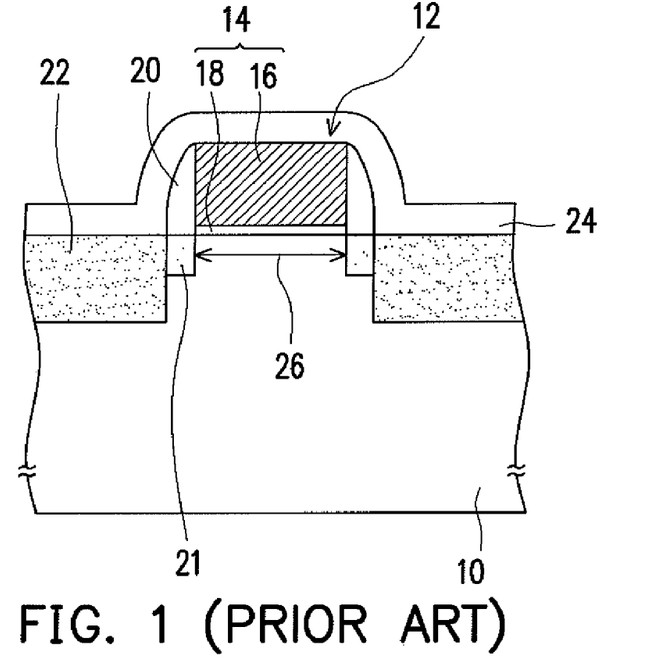
FIG. 1 illustrates a cross-sectional view of a semiconductor structure including a MOS transistor and a stress layer in the prior art.

FIG. 1 illustrates a cross-sectional view of a semiconductor structure including a MOS transistor and a stress layer in the prior art. The structure includes a substrate 10, a MOS transistor 12 and a stress layer 24 over the same. The transistor 12 includes a gate structure 14 including gate dielectric 18 on the substrate 10 and a gate 16 thereon, a spacer 20 on the sidewall of the gate structure 14, a source/drain (S/D) extension region 21 in the substrate 10 beside the gate structure 14, and an S/D region 22 in the substrate 10 beside the spacer 20. When the transistor 12 is a PMOS (or NMOS) transistor, the stress layer 24 is a compressive (or tensile) stress layer that applies a compressive (or tensile) stress in the direction of the channel 26.

However, with the development of electronic industry, a higher performance is always required for semiconductor devices. It is promising to find a way to further raise the stress in the channel direction and improve the hole or electron mobility.

SUMMARY OF THE INVENTION

Accordingly, this invention provides a semiconductor structure that further raises the stress in the channel direction and thereby increase the carrier mobility to increase the driving current and improve the device performance.

This invention also provides a method for fabricating a semiconductor structure of this invention.

The method for fabricating a semiconductor structure is described as follows. A substrate is provided, having thereon a gate structure and a spacer on the sidewall of the gate structure and having therein an S/D extension region beside the gate structure. An opening is formed in the substrate beside the spacer, and an S/D region is formed in or on the substrate at the bottom of the opening. A metal silicide layer is formed on the S/D region and the gate structure, and a stress layer is formed over the substrate.

In an embodiment, the opening may be formed by forming over the substrate a patterned photoresist layer exposing the substrate beside the spacer and, etching and removing a portion of the exposed substrate using the patterned photoresist layer and the spacer as a mask and then removing the patterned photoresist layer. The etching may be isotropic etching, anisotropic etching or tapered etching.

In some embodiments, the metal silicide layer may be formed through a self-aligned silicide (salicide) process. The S/D region may be formed through an ion implantation process using the spacer and the gate structure as a mask, or through selective epitaxy growth (SEG) with in-situ doping. The stress layer preferably has a sufficient thickness to at least fill up the opening, and may be a compressive or tensile stress layer. The opening may have a depth of about 100-1000 Å.

Accordingly, the semiconductor structure includes a substrate, an S/D extension region, an S/D region, a metal silicide layer and a stress layer. The substrate has thereon a gate structure and a spacer on the sidewall of the gate structure, and has therein an opening beside the spacer. The S/D extension region is in the substrate beside the gate structure, and the S/D region is in or on the substrate at the bottom of the opening. The metal silicide layer is disposed on the S/D region and the gate structure, and the stress layer is disposed over the substrate.

In the semiconductor structure, the S/D region may be an implanted region in the substrate at the bottom of the opening, or a doped epitaxial layer on the substrate at the bottom of the opening. The doped epitaxial layer may include doped SiGe or SiC.

An embodiment of the above method for fabricating a semiconductor structure is also described below. A substrate is provided, having thereon a first and a second gate structures. A first S/D extension region of a first conductivity type is formed in the substrate beside the first gate structure, and a second S/D extension region of a second conductivity type is formed in the substrate beside the second gate structure. A first spacer is formed on the sidewall of the first gate structure, and a second spacer is formed on that of the second gate structure. An opening is formed in the substrate beside the first spacer. A first S/D region of the first conductivity type is formed in or on the substrate at the bottom of the opening to form a first MOS transistor of the first conductivity type, and a second S/D region of the second conductivity type is formed in the substrate beside the second spacer to form a second MOS transistor of the second conductivity type. A first stress layer is formed over the first MOS transistor, and a second stress layer is formed over the second MOS transistor.

In some examples, a metal silicide layer may be further formed on the first and the second S/D regions and the first and the second gate structures with, for example, a salicide process. The opening can be formed by forming over the substrate a patterned photoresist layer exposing the substrate beside the first spacer, etching and removing a portion of the exposed substrate using the patterned photoresist layer and the first spacer as a mask and then removing the photoresist layer. The etching may be isotropic, anisotropic or tapered.

The first S/D region may be formed through an ion implantation process of the first conductivity type using the first spacer and the first gate structure as a mask, or through SEG with in-situ doping. The second S/D region may be formed through an ion implantation process of the second conductivity type using the second spacer and the second gate structure as a mask. The first stress layer preferably has a sufficient thickness to at least fill up the opening. The first S/D extension region may be formed through an ion implantation process of the first conductivity type using the first gate structure as a mask, and the second S/D extension region may be formed through an ion implantation process of the second conductivity type using the second gate structure as a mask. The opening may have a depth of about 100-1000 Å. In addition, when the first and the second conductivity types are respectively P-type and N-type, the first stress layer is a compressive stress layer and the second stress layer a tensile stress layer. When the first and the second conductivity types are respectively N-type and P-type, the first stress layer is a tensile stress layer and the second stress layer is a compressive one.

An embodiment of the above semiconductor structure is also described below, including a substrate, a first MOS transistor of a first conductivity type and a second MOS transistor of a second conductivity type on the substrate, a first stress layer over the first MOS transistor, and a second stress layer over the second MOS transistor. The first MOS transistor includes a first gate structure on the substrate, a first spacer on a sidewall of the first gate structure, a first S/D extension region of the first conductivity type in the substrate beside the first gate structure, and a first S/D region of the first conductivity type in or on the substrate at the bottom of the opening, while the substrate has an opening therein beside the first spacer. The second MOS transistor includes a second gate structure on the substrate, a second spacer on a sidewall of the second gate structure, a second S/D extension region of the second conductivity type in the substrate beside the second gate structure, and a second S/D region of the second conductivity type in the substrate beside the second spacer.

In some embodiments, the semiconductor structure may further include a metal silicide layer on the first and the second S/D regions and the first and the second gate structures. The first stress layer preferably has a sufficient thickness to at least fill up the opening. The first S/D region may be an implanted region in the substrate at the bottom of the opening.

In addition, when the first and the second conductivity types are respectively P-type and N-type, the first stress layer is a compressive stress layer and the second stress layer a tensile stress layer, and the first S/D region may be a P-doped SiGe epitaxial layer on the substrate at the bottom of the opening. When the first and the second conductivity types are respectively N-type and P-type, the first stress layer is a tensile one and the second stress layer a compressive one, and the first S/D region may be an N-doped SiC epitaxial layer on the substrate at the bottom of the opening.

Since an opening is formed in the substrate beside the spacer and the stress layer fills in the opening, the stress in the channel direction is larger to increase the electron or hole mobility in the channel and improve the performance of the device. Moreover, the metal silicide layer can lower the resistivities of the S/D region and the gate to further improve the performance of the device.

It is to be understood that both the foregoing general description and the following detailed description are exemplary, and are intended to provide further explanation of the invention as claimed.

DESCRIPTION OF THE PREFERRED EMBODIMENTS

Figure 2A:
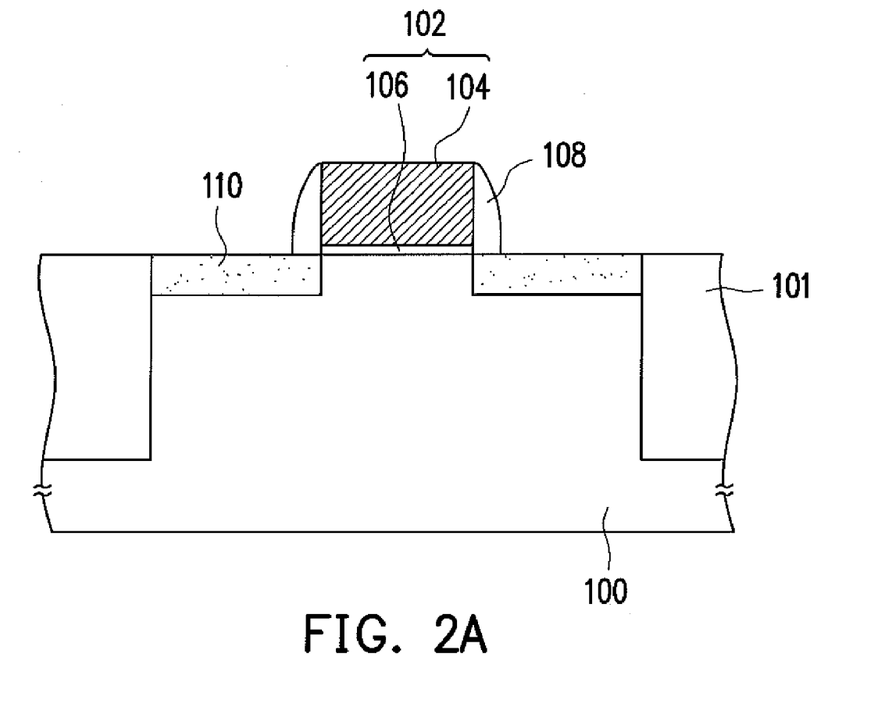
FIGS. 2A-2C illustrate, in a cross-sectional view, a process flow of fabricating a semiconductor structure according to an embodiment of this invention.
Figure 2B:
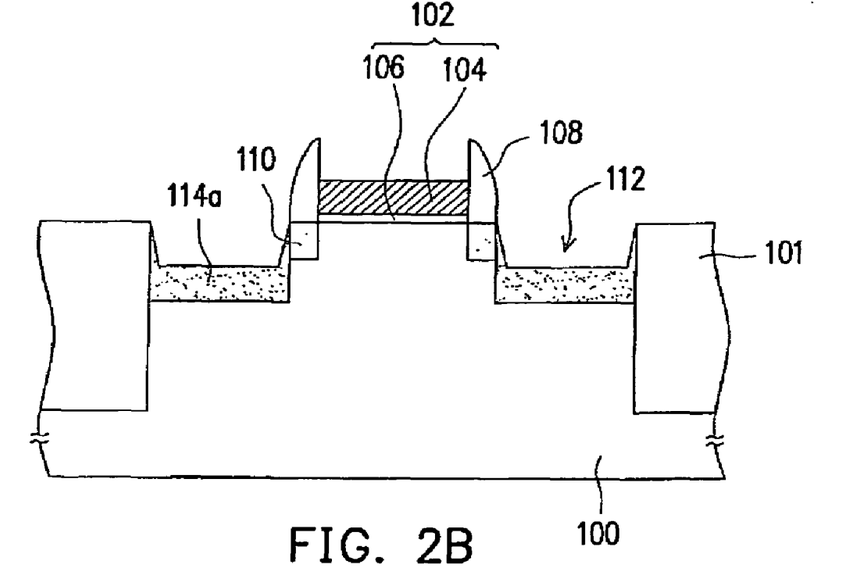
Figure 2C:
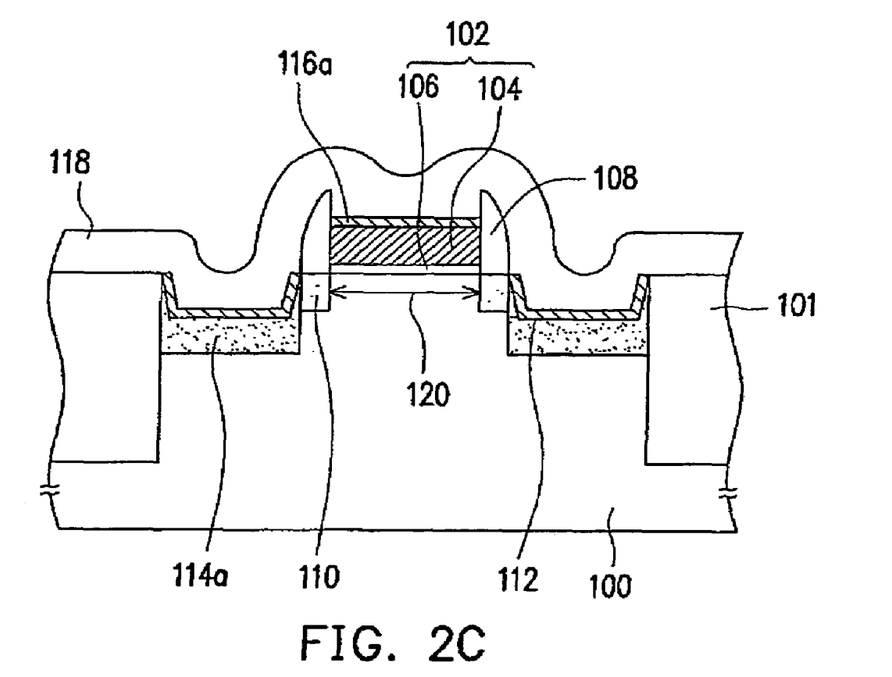

FIGS. 2A-2C illustrate, in a cross-sectional view, a process flow of fabricating a semiconductor structure according to an embodiment of this invention, wherein FIG. 2C shows the resulting semiconductor structure.

Referring to FIG. 2A, a substrate 100 is provided, having therein an isolation structure 101 like an STI structure that defines an active area. A gate structure 102 has been formed on the substrate 100, including a gate dielectric layer 106 on the substrate 100 and a gate 104 on the gate dielectric layer 106. The gate structure 102 can be formed by forming a dielectric layer and a conductive layer sequentially and pattering them in reversed sequence. The material of the gate dielectric layer 106 may be silicon oxide, while that of the gate 104 may be polysilicon or metal. A spacer 108 has been formed on the sidewall of the gate structure 102, possibly by forming a conformal dielectric layer over the substrate 100 and then anisotropically etching the same. The material of the spacer 108 may be SiO, SiN or SiON. An S/D extension region 110 has been formed in the substrate 100 beside the gate structure 102 with, for example, P-or N-type ion implantation with the gate structure 102 as a mask.

Referring to FIG. 2B, an opening 112 is formed in the substrate 100 beside the spacer 108, possibly having a depth of about 100-1000 Å and being shallower or deeper than the S/D extension region 110. The opening 112 may be formed by forming a patterned photoresist layer on the substrate 100 exposing the substrate 100 beside the spacer 108, etching and removing a portion of the exposed substrate 100 using the patterned photoresist layer and the spacer 108 as a mask and then removing the patterned photoresist layer, wherein the etching may be isotropic etching, anisotropic etching or tapered etching. It is noted that when the substrate 100 includes silicon and the gate 104 includes poly-Si, the gate 104 is also recessed in the step of forming the opening 112, as shown in FIG. 2B. To protect the gate 104 from being recessed, a cap layer may be formed on the gate 104 previously (not shown). An S/D region 114a is then formed in the substrate 100 at the bottom of the opening 112. The S/D region 114a may be formed with ion implantation using the spacer 108 and the gate structure 102 as a mask, wherein the conductivity type of the dopant is the same as that of the dopant of the S/D extension region 110.

Referring to FIG. 2C, a metal silicide layer 116a is formed on the S/D region 114a and the gate structure 102, possibly with a self-aligned silicide (salicide) process. The material of the metal silicide layer 116a may be a silicide of W, Ti, Co, Mo, Ni, Pd or Pt. A stress layer 118, such as a SiN layer, is formed over the substrate 100 through CVD, for example, while the deposition recipe may be adjusted to make the stress layer 118 a compressive one or a tensile one. The stress layer 118 preferably has a sufficient thickness to at least fill up the opening 112, so that a higher stress is generated in the direction of the channel 120 to greatly increase the carrier mobility in the channel 120.

Figure 3A:
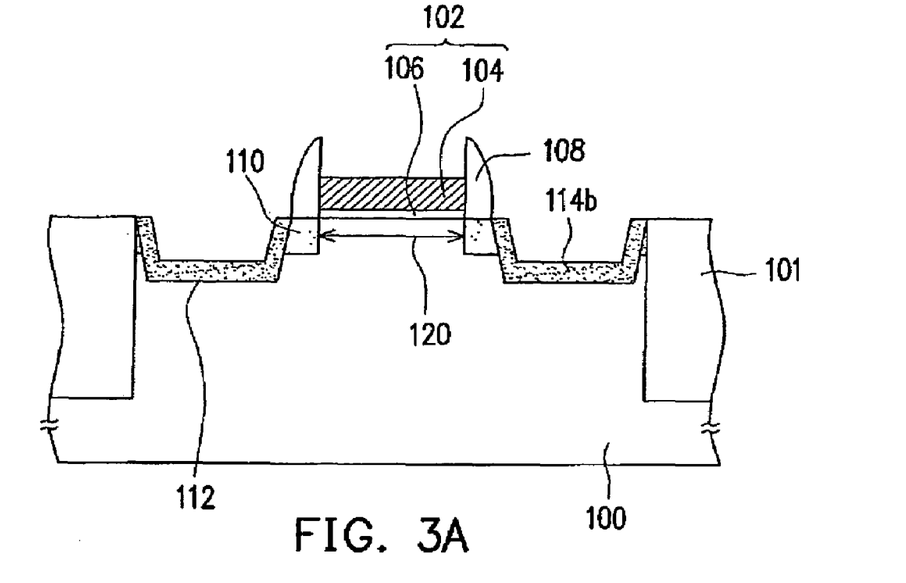
FIGS. 3A-3B illustrate, in a cross-sectional view, a process flow of fabricating a semiconductor structure according to another embodiment of this invention.
Figure 3B:
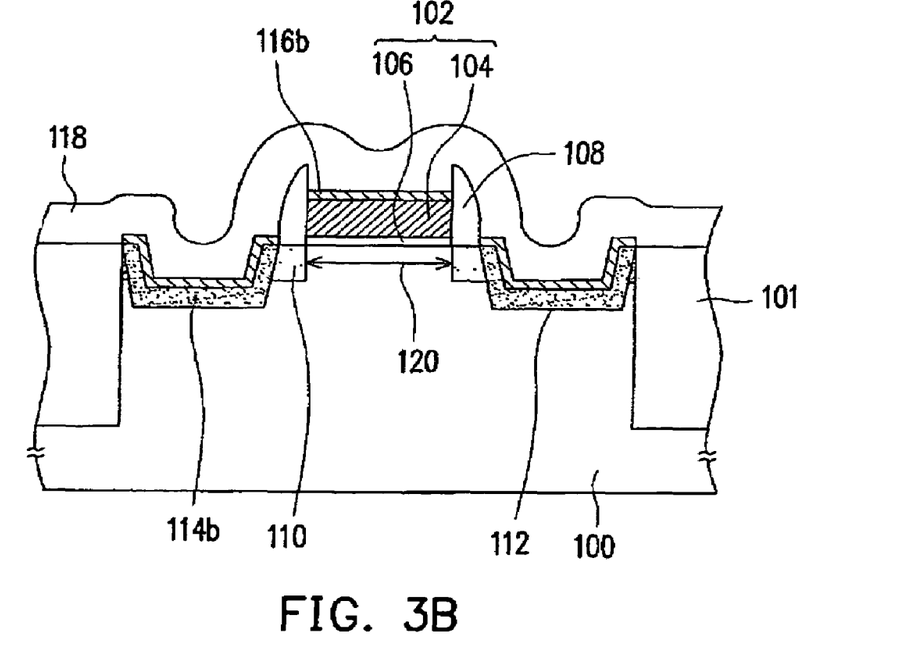

It is noted that the S/D region may alternatively be formed through SEG. FIGS. 3A-3B illustrate such a process according to another embodiment of this invention.

Referring to FIG. 3A, the process is different from that shown in FIG. 2B in that the S/D region 114b is formed on the substrate 100 at the bottom of the opening 112, possibly with an SEG process based on the substrate 100 exposed in the opening 112. The S/D region 114b formed with SEG is an epitaxial layer, which may include SiGe or SiC. It is also noted that there has to be sufficient space in the opening 112 after the epitaxy layer is formed, so that the stress layer filling into the opening 112 later can have a sufficient thickness to cause a larger stress in the direction of the channel 120.

Referring to FIG. 3B, a metal silicide layer 116b is formed on the S/D region 114b and the gate structure 102, possibly with a salicide process. Examples of the material of the metal silicide layer 116b are the same as above. A compressive or tensile stress layer 118 is then formed over the substrate 100.

Figure 4A:
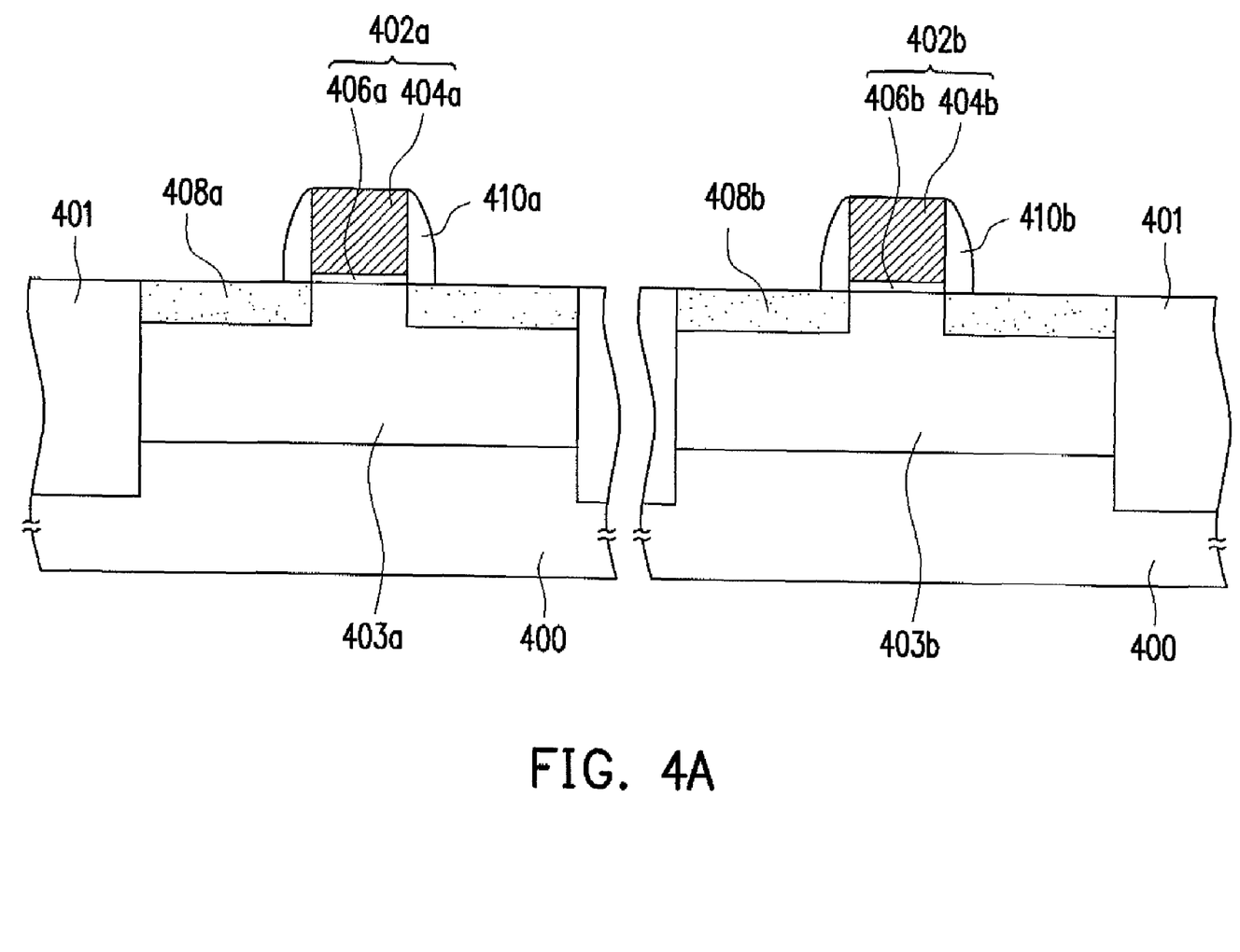
FIGS. 4A-4C illustrate, in a cross-sectional view, a process flow of fabricating a semiconductor structure according to still another embodiment of this invention.
Figure 4B:
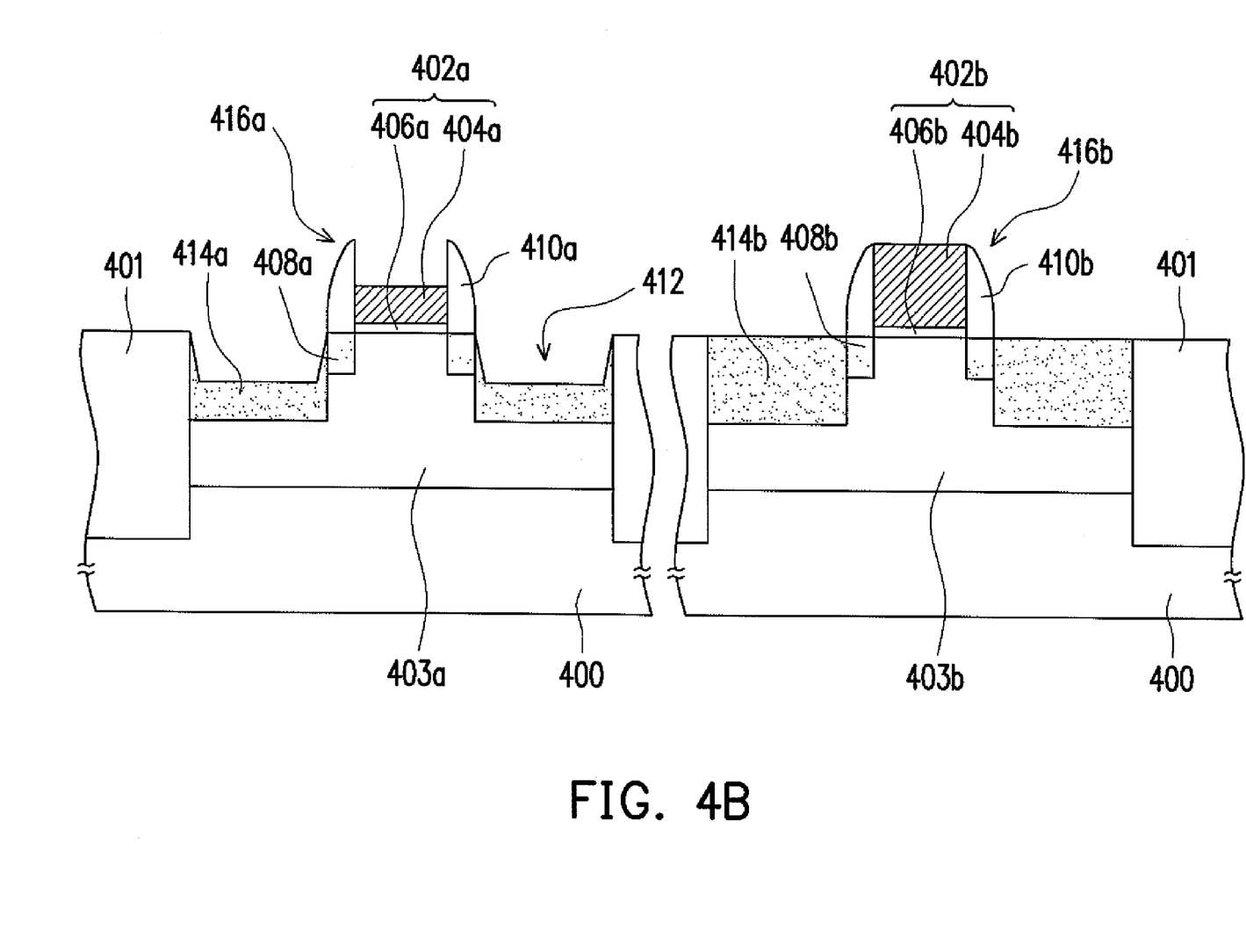
Figure 4C:
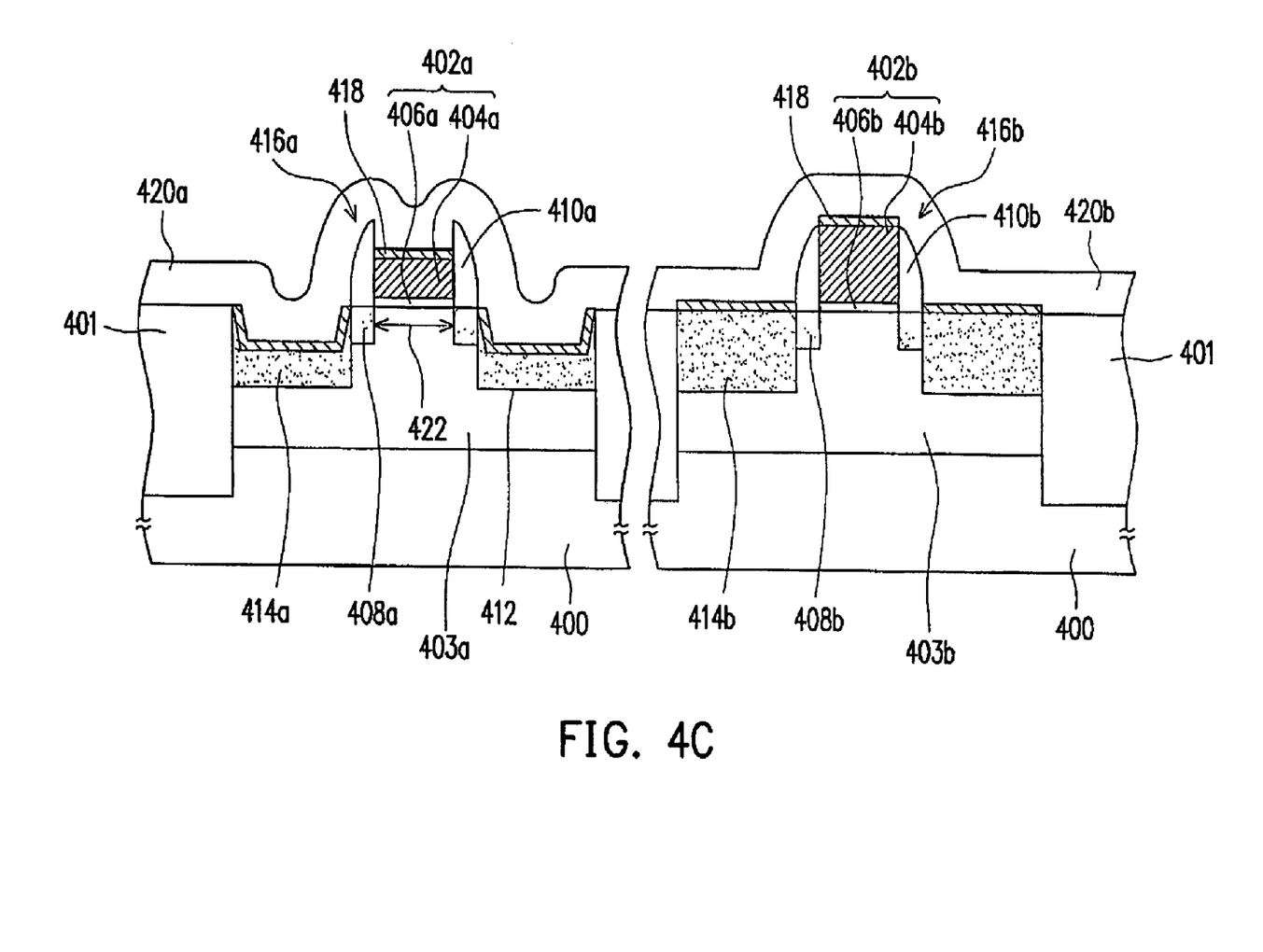

FIGS. 4A-4C illustrate, in a cross-sectional view, a process flow of fabricating a semiconductor structure according to still another embodiment of this invention.

Referring to FIG. 4A, a substrate 400 with a well 403b of a first conductivity type and a well 403a of a second conductivity type therein is provided. Gate structures 402a and 402b and an isolation structure 401 have also been formed on the substrate 400, wherein the gate structures 402a and 402b are respectively over the wells 403a and 403b and the isolation structure 401 like an STI structure defines the active areas. The gate structure 402a/b includes a gate dielectric layer 406a/b on the substrate 400 and a gate 404a/b on the gate dielectric layer 406a/b.

Then, an S/D extension region 408a of the first conductivity type is formed in the well 403a beside the gate structure 402a, and an S/D extension region 408b of the second conductivity type is formed in the well 403b beside the gate structure 402b. The S/D extension regions 408a and 408b may be formed with the following steps. A patterned photoresist layer is formed over the substrate 400 exposing the gate structure 402a and the substrate area for forming the S/D extension regions 408a, and then ion implantation is done to implant a dopant of the first conductivity type with the patterned photoresist layer and the gate structure 402a as a mask. After the patterned photoresist layer is removed, another patterned photoresist layer is formed over the substrate 400 exposing the gate structure 402b and the substrate area for forming the S/D extension regions 408b, and another ion implantation process is done to implant a dopant of the second conductivity type with the patterned photoresist layer and the gate structure 402b as a mask. The second patterned photoresist layer is then removed. Thereafter, a spacer 410a is formed on the sidewall of the gate structure 402a, and a spacer 410b is formed on that of the gate structure 402b.

Referring to FIG. 4B, an opening 412 is formed in the substrate 400 beside the spacer 410a. The opening 412 may have a depth of about 100-1000 Å, and may be formed shallower or deeper than the S/D extension region 408a. The opening 412 may be formed by forming a patterned photoresist layer on the substrate 400 exposing the substrate 400 beside the spacer 410a, etching and removing a portion of the exposed substrate 400 using the patterned photoresist layer and the spacer 410a as a mask and then removing the patterned photoresist layer, wherein the etching may be isotropic, anisotropic or tapered. It is noted that when the substrate 400 includes silicon and the gate 404a includes poly-Si, the gate 404a is also recessed in the step of forming the opening 412, as shown in FIG. 4B. To protect the gate 404a from being recessed, a cap layer may be formed on the gate 404a previously (not shown).

After the opening 412 is formed, an S/D region 414a of the first conductivity type is formed in the substrate 400 at the bottom of the opening 412 to form a MOS transistor 416a of the first conductivity type. An S/D region 414b of the second conductivity type is formed in the substrate 400 beside the spacer 410b to form a MOS transistor 416b of the second conductivity type. The S/D regions 414a and 414b can be formed with the following steps. A patterned photoresist layer is formed over the substrate 400 exposing the spacer 410a, the gate structure 402a and the substrate 400 at the bottom of the opening 412. Ion implantation is done with the patterned photoresist layer, the spacer 410a and the gate structure 402a as a mask to implant a dopant of the first conductivity type into the substrate 400 at the bottom of the opening 412. After the patterned photoresist layer is removed, another patterned photoresist layer is formed over the substrate 400 exposing the spacer 410b, gate structure 402b and the substrate 400 beside the spacer 410b. Another ion implantation process is then done with the patterned photoresist layer, the spacer 410b and the gate structure 402b as a mask to implant a dopant of the second conductivity type into the substrate 400 beside the spacer 410b. The second patterned photoresist layer is then removed.

Referring to FIG. 4C, a metal silicide layer 418 is formed on the SiD regions 414a and 414b and the gate structures 402a and 402b. The metal silicide layer 418 may be formed through a salicide process, and examples of the material of the metal silicide layer 418 are the same as the aforementioned. Then, a stress layer 420a is formed over the MOS transistor 416a, and a stress layer 420b is formed over the MOS transistor 416b. The stress layers 420a and 420b may be formed with the following steps. A layer of the material of the stress layer 420a is formed over both of the MOS transistors 416a and 416b, possibly through CVD, and then the portion of the layer over the MOS transistor 416b is removed The stress layer 420b is then formed over the MOS transistor 416b. The stress layers 420a and 420b may include the same material like SiN, but are formed with different deposition recipes so that one of the stress layers 420a and 420b is a compressive stress layer and the other a tensile stress layer. It is also noted that the stress layer 420a preferably has a sufficient thickness to at least fill up the opening 412, so that a higher stress can be caused in the direction of the channel 422 increasing the electron or hole mobility in the channel 422.

In this embodiment, the stress layer 420a is a compressive stress layer and the stress layer 420b a tensile stress layer when the first and the second conductivity types are respectively P-type and N-type. Alternatively, the stress layer 420a is a tensile stress layer and the stress layer 420b a compressive stress layer when the first and the second conductivity types are respectively N-type and P-type.

In yet another embodiment, the S/D region 414a is alternatively formed through SEG with in-situ doping, wherein the S/D region 414b is covered by a blocking layer formed previously. When the first and the second conductivity types are respectively P-type and N-type, a P-doped SiGe epitaxial layer may be grown on the substrate 400 at the bottom of the opening 412 to serve as the S/D region of the MOS transistor 416a. When the first and the second conductivity types are respectively N-type and P-type, an N-doped SiC epitaxial layer may be grown on the substrate 400 at the bottom of the opening 412 to serve as the S/D region of the MOS transistor 416a.

To prove the utility of this invention, the effects of a conventional stress layer and an opening-filling stress layer of this invention are compared based on the increased performances of PMOS and NMOS transistors relative to the PMOS and NMOS transistors without any stress layer. The result is shown in Table 1.

TABLE 1

| | Increased performance (%) relative to the transistors without any stress layer | |
|---|---|---|
| | Conventional stress layer | Opening-filling stress layer of this invention |
| NMOS transistor | 17.6% | 21.7% |
| PMOS transistor | 31.1% | 37.0% |

As indicated by Table 1, the performance of a PMOS or NMOS transistor with an opening-filling stress layer of this invention is apparently higher than that of a PMOS or NMOS transistor with a conventional stress layer.

Moreover, the metal silicide layer formed on the S/D regions and the gates can lower the resistivities of the same to further improve the performance of the device.

It will be apparent to those skilled in the art that various modifications and variations can be made to the structure of the present invention without departing from the scope or spirit of the invention. In view of the foregoing, it is intended that the present invention covers modifications and variations of this invention provided they fall within the scope of the following claims and their equivalents.

What is claimed is:

1. A semiconductor structure, comprising:
   a substrate that has thereon a gate structure and a spacer on a sidewall of the gate structure and has therein a recess beside the spacer;
   an S/D extension region in the substrate beside the gate structure;
   an S/D region in the substrate-surrounding the recess, wherein the S/D region comprises a doped epitaxial layer on the substrate at the bottom of the recess;
   a stress layer over the substrate, a part of the stress layer filled in the recess; and
   a metal silicide layer between the S/D region and the stress layer, and between the gate structure and the stress layer.

2. The semiconductor structure of claim 1, wherein the stress layer has a sufficient thickness to at least fill up the recess.

3. The semiconductor structure of claim 1, wherein the stress layer is a compressive stress layer or a tensile stress layer.

4. The semiconductor structure of claim 1, wherein the S/D region comprises an implanted region in the substrate at the bottom of the recess.

5. The semiconductor structure of claim 1, wherein the doped epitaxial layer comprises doped SiGe or doped SiC.

6. A semiconductor structure, comprising:
   a substrate;
   a first MOS transistor of a first conductivity type on the substrate, comprising:
      a first gate structure on the substrate;
      a first spacer on a sidewall of the first gate structure, while the substrate has a recess therein beside the first spacer;
      a first S/D extension region of the first conductivity type in the substrate beside the first gate structure; and
      a first S/D region of the first conductivity type in the substrate surrounding the recess;
   a second MOS transistor of a second conductivity type on the substrate, comprising:
      a second gate structure on the substrate;
      a second spacer on a sidewall of the second gate structure;
      a second S/D extension region of the second conductivity type in the substrate beside the second gate structure; and
      a second S/D region of the second conductivity type in the substrate beside the second spacer;
   a first stress layer over the first MOS transistor, a part of the first stress layer filled in the recess; and
   a second stress layer over the second MOS transistor, wherein the first conductivity type is P-type, the second conductivity type is N-type, the first stress layer is a compressive stress layer, the second stress layer is a tensile stress layer, the first S/D region comprises a P-doped SiGe layer on the substrate at the bottom of the recess, and the P-doped epitaxial layer comprises P-doped SiGe.

7. The semiconductor structure of claim 6, further comprising a metal silicide layer on the first and the second S/D regions and the first and the second gate structures.

8. The semiconductor structure of claim 6, wherein the first stress layer has a sufficient thickness to at least fill up the recess.

9. The semiconductor structure of claim 6, wherein the first S/D region comprises an implanted region in the substrate at the bottom of the recess.

10. A semiconductor structure comprising:
    a substrate;
    a first MOS transistor of a first conductivity type on the substrate, comprising:
       a first gate structure on the substrate:
       a first spacer on a sidewall of the first gate structure, while the substrate has a recess therein beside the first spacer;
       a first S/D extension region of the first conductivity type in the substrate beside the first gate structure; and
       a first S/D region of the first conductivity type in the substrate surrounding the recess;
    a second MOS transistor of a second conductivity type on the substrate, comprising:
       a second gate structure on the substrate;
       a second spacer on a sidewall of the second gate structure;
       a second S/D extension region of the second conductivity type in the substrate beside the second gate structure; and
       a second S/D region of the second conductivity type in the substrate beside the second spacer;
    a first stress layer over the first MOS transistor, a part of the first stress layer filled in the recess; and
    a second stress layer over the second MOS transistor, wherein the first conductivity type is N-type, the second conductivity type is P-type, the first stress layer is a tensile stress layer, the second stress layer is a compressive stress layer, the first S/D region comprises an N-doped epitaxial layer on the substrate at the bottom of the recess, and the N-doped epitaxial layer comprises N-doped SiC.

11. The semiconductor structure of claim 10, further comprising a metal silicide layer on the first and the second S/D regions and the first and the second gate structures.

12. The semiconductor structure of claim 10, wherein the first stress layer has a sufficient thickness to at least fill up the recess.

13. The semiconductor structure of claim 10, wherein the first S/D region comprises an implanted region in the substrate at the bottom of the recess.

* * * * *